US012660640B2

(12) United States Patent
Kim et al.

(10) Patent No.: US 12,660,640 B2
(45) Date of Patent: Jun. 16, 2026

(54) SEMICONDUCTOR DEVICE PACKAGE FOR PRESS FIT ASSEMBLY

(71) Applicant: Texas Instruments Incorporated, Dallas, TX (US)

(72) Inventors: Kwang-Soo Kim, Sunnyvale, CA (US); Makoto Shibuya, Tokyo (JP); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 501 days.

(21) Appl. No.: 18/194,463

(22) Filed: Mar. 31, 2023

(65) Prior Publication Data

US 2024/0332141 A1 Oct. 3, 2024

(51) Int. Cl.
| | |
|---|---|
| *H10W 70/40* | (2026.01) |
| *H10W 40/25* | (2026.01) |
| *H10W 70/05* | (2026.01) |
| *H10W 72/00* | (2026.01) |
| *H10W 72/50* | (2026.01) |
| *H10W 74/01* | (2026.01) |
| *H10W 74/10* | (2026.01) |
| *H10W 90/00* | (2026.01) |

(52) U.S. Cl.
CPC ....... *H10W 70/429* (2026.01); *H10W 40/255* (2026.01); *H10W 70/093* (2026.01); *H10W 70/481* (2026.01); *H10W 74/01* (2026.01); *H10W 74/114* (2026.01); *H10W 72/5363* (2026.01); *H10W 72/552* (2026.01); *H10W 72/5522* (2026.01); *H10W 72/5524* (2026.01);

*H10W 72/5525* (2026.01); *H10W 72/555* (2026.01); *H10W 72/884* (2026.01); *H10W 90/736* (2026.01); *H10W 90/753* (2026.01); *H10W 90/755* (2026.01)

(58) Field of Classification Search
None
See application file for complete search history.

(56) References Cited

U.S. PATENT DOCUMENTS

| | | | |
|---|---|---|---|
| 2008/0029860 A1* | 2/2008 | Gao | H01L 24/49 |
| | | | 257/E23.051 |
| 2008/0224285 A1* | 9/2008 | Lim | H01L 23/49575 |
| | | | 257/E23.092 |

(Continued)

*Primary Examiner* — Sue A Purvis
*Assistant Examiner* — Jordan M Klein
(74) *Attorney, Agent, or Firm* — Dawn Jos; Frank D. Cimino

(57) ABSTRACT

A semiconductor device includes: a package substrate having a device mount surface and on an opposite bottom side surface; at least one semiconductor die mounted on the device mount surface; and leads having a base portion attached to the device mount surface and having an internal portion extending away from a first bend at a first angle, the internal portion of the leads extending to a second bend, a remaining portion of the leads extending from the second bend and lying in a horizontal plane parallel to the device mount surface, the leads having a third bend in the remaining portion forming terminals extending at a second angle with respect to the horizontal plane of the remaining portion. Mold compound covers the device mount surface, portions of the leads, and the semiconductor die. The terminals are exposed at a board side surface of the mold compound.

20 Claims, 8 Drawing Sheets

(56)　　　　　References Cited

U.S. PATENT DOCUMENTS

2013/0334672 A1 *  12/2013  Denta  ................... H01L 23/495
　　　　　　　　　　　　　　　　　　　　　 438/123
2020/0231800 A1 *   7/2020  Roth  ..................... H01L 23/295
2021/0235579 A1 *   7/2021  Miyasaka  ............ H05K 3/3447

* cited by examiner

101

105

103

104

1B

105

108

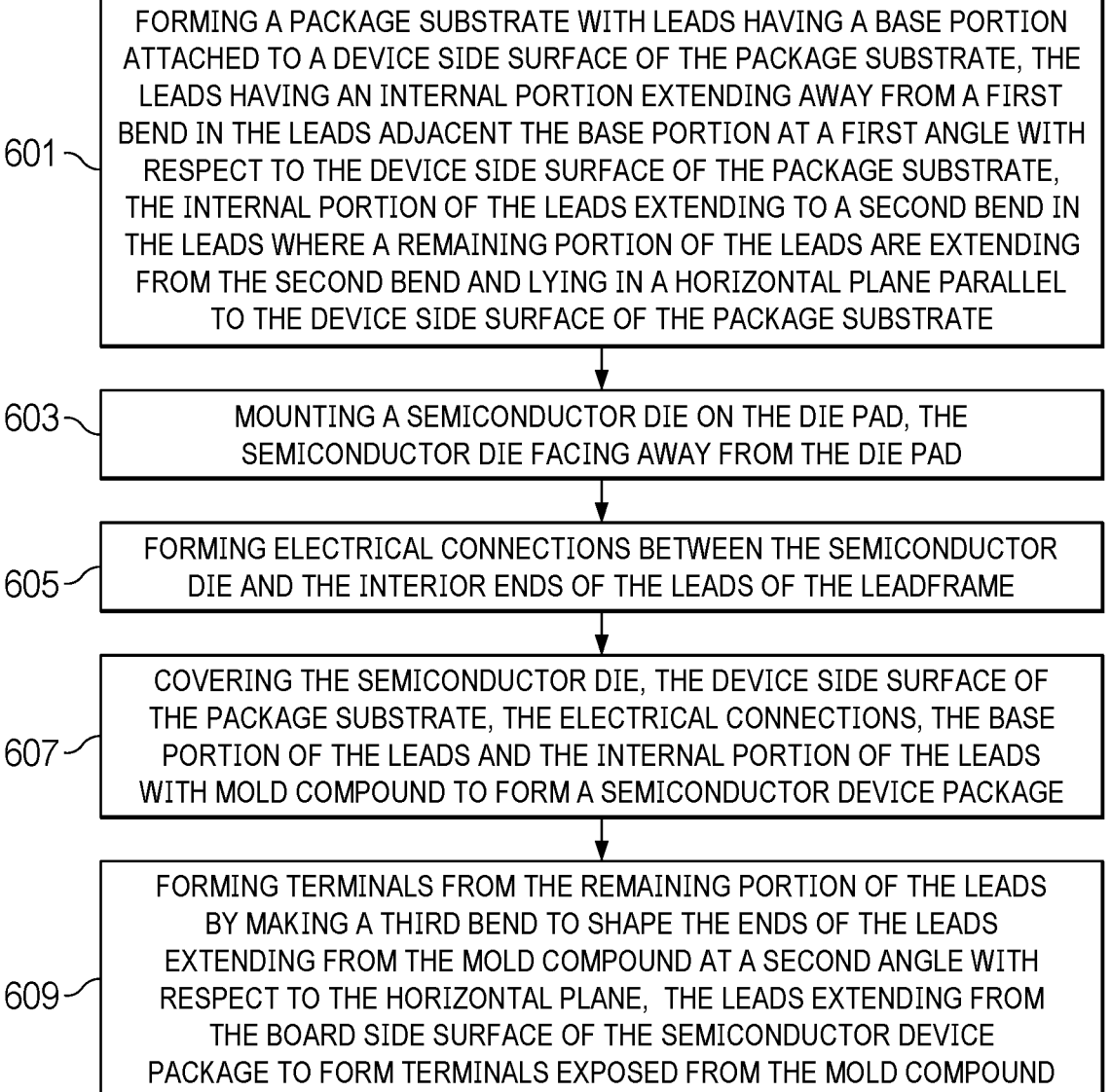

601 — FORMING A PACKAGE SUBSTRATE WITH LEADS HAVING A BASE PORTION ATTACHED TO A DEVICE SIDE SURFACE OF THE PACKAGE SUBSTRATE, THE LEADS HAVING AN INTERNAL PORTION EXTENDING AWAY FROM A FIRST BEND IN THE LEADS ADJACENT THE BASE PORTION AT A FIRST ANGLE WITH RESPECT TO THE DEVICE SIDE SURFACE OF THE PACKAGE SUBSTRATE, THE INTERNAL PORTION OF THE LEADS EXTENDING TO A SECOND BEND IN THE LEADS WHERE A REMAINING PORTION OF THE LEADS ARE EXTENDING FROM THE SECOND BEND AND LYING IN A HORIZONTAL PLANE PARALLEL TO THE DEVICE SIDE SURFACE OF THE PACKAGE SUBSTRATE

603 — MOUNTING A SEMICONDUCTOR DIE ON THE DIE PAD, THE SEMICONDUCTOR DIE FACING AWAY FROM THE DIE PAD

605 — FORMING ELECTRICAL CONNECTIONS BETWEEN THE SEMICONDUCTOR DIE AND THE INTERIOR ENDS OF THE LEADS OF THE LEADFRAME

607 — COVERING THE SEMICONDUCTOR DIE, THE DEVICE SIDE SURFACE OF THE PACKAGE SUBSTRATE, THE ELECTRICAL CONNECTIONS, THE BASE PORTION OF THE LEADS AND THE INTERNAL PORTION OF THE LEADS WITH MOLD COMPOUND TO FORM A SEMICONDUCTOR DEVICE PACKAGE

609 — FORMING TERMINALS FROM THE REMAINING PORTION OF THE LEADS BY MAKING A THIRD BEND TO SHAPE THE ENDS OF THE LEADS EXTENDING FROM THE MOLD COMPOUND AT A SECOND ANGLE WITH RESPECT TO THE HORIZONTAL PLANE, THE LEADS EXTENDING FROM THE BOARD SIDE SURFACE OF THE SEMICONDUCTOR DEVICE PACKAGE TO FORM TERMINALS EXPOSED FROM THE MOLD COMPOUND

FIG. 6

SEMICONDUCTOR DEVICE PACKAGE FOR PRESS FIT ASSEMBLY

TECHNICAL FIELD

This disclosure relates generally to semiconductor device packages, and more particularly to semiconductor device packages including a semiconductor die mounted to a lead-frame in a molded package with leads.

BACKGROUND

Dual in line pin (DIP) semiconductor device packages are widely used for a variety of applications. In one example, an integrated power module (IPM) can be formed using a field effect transistor (FET) or several FETs mounted in a DIP package. The FETs are sometimes referred to as "power FETs" as these transistors are arranged to conduct high currents (in the ampere range and up to hundreds of amperes) at high voltages (greater than 20V and up to several hundred volts). The IPMs can include a power FET semiconductor die and associated semiconductor dies and can include passive components needed to provide an integrated power device in a single package. The power FETs can be of materials particularly suited for high voltage applications, including silicon carbide (SiC) and gallium nitride (GaN) FET devices, which have high voltage ratings and relatively low device drain-to-source on resistances ($Rds_{on}$) when compared to silicon FET devices. The power FETs are metal oxide semiconductor (MOS) FETs, while other devices in the integrated power module can be silicon MOS FET devices, such as complementary MOS (CMOS) controllers and transistor gate driver semiconductor devices of any of these technologies. The semiconductor dies are mounted to a package substrate, such as a leadframe, and the semiconductor die devices are coupled to leads using wires, wire bonds, or are flip chip mounted to the leads. In the DIP packages, the leads form device terminals that exit the mold compound that forms the package body on a side portion, usually at or near the middle of the sides of the molded semiconductor device package. The terminals are shaped to extend at an angle to a bottom surface of the package, such as a normal angle, and form pins for insertion into sockets, for example, or for through hole mounting by insertion into a plated hole in a printed circuit board or module.

To form a power system using the IPMs, a printed board assembly (PBA) process is used. A printed circuit board (PCB) is provided that is patterned to mount the devices needed. Certain passive components are mounted on one side of the printed circuit board and may be mounted using surface mount technology (SMT) processes, such as a thermal solder reflow to form solder joints. Through hole mounting can be used for the DIP devices, and also for larger passive components (sometimes referred to as through hole devices (THDs) that are also mounted using through hole mounting technology.

In an example assembly process, a printed circuit board (PCB) has a first side and a second side, the first side having traces configured for mounting SMDs. IPMs are mounted on the second side of the PCB, in an example the IPMs are transistors in DIP semiconductor device packages. The IPMs are placed with the DIP pins extending through plated through holes to the first side of the PCB, and a solder wave process is used on the first side of the PCB to solder the extended ends of the DIP pins to the plated through holes. The board is then rotated so that the first side is facing upwards, and surface mount devices (SMD) are mounted on the first side using surface mount technology processing, opposite from the DIP packages now mounted on the second side. The IPM DIP packages previously mounted on the second side are then covered or protected by a cover, dam or well, and through hole mounted passive devices (THDs), such as large value inductors or capacitors, are mounted on the first side with through hole terminals extending through the PCB to the second side in through holes. While the DIPs of the IPDs mounted on the second side are protected, a second solder wave process applies molten solder on the second side of the PCB to solder to the pins of the THDs, and the solder wave process forms solder joints between the pins of the THD passives and the plated through holes.

After all the devices to be assembled are mounted on both sides of the PCB, a heat sink or heat shield can be mounted to the second side of the PCB, with the backside of the DIP packages (which can include a thermal pad that is thermally coupled to the semiconductor dies inside the DIPs) in thermal and electrical contact to the heat sink. The completed printed board assembly is a power system. Example applications for power systems on PBAs include modules supplying power to motors such as in electric vehicles, and to motors and equipment in factory automation, in other automotive applications, for portable devices with battery chargers, step converters, and/or power inverters to provide direct current (DC) or alternating current (AC) voltages from batteries, or to supply voltages to batteries.

Performing the printed board assembly (PBA) process described above requires two solder wave processes, and there are several parameters needed for the processes that are difficult to meet when using existing DIP packages for the IPMs. In order to perform the solder wave mount of the IPM DIP packages and to perform the solder wave for the through hole device passives, a maximum DIP package thickness is needed. However, for high voltage semiconductor devices where a terminal carries a high voltage, a minimum clearance distance must be maintained between the exposed high voltage terminals and the heat shield (which is a conductor at ground or another potential). This minimum clearance distance parameter creates a minimum thickness for the DIP packages that can conflict with the maximum package thickness needed for the solder wave processes. These two board design parameters are in conflict and sometimes cannot both be satisfied.

An alternative approach is to provide the power semiconductor devices mounted in a "press fit" IPM. Press fit device assembly involves inserting a press fit pin or terminal into a through hole in a case or cover. The through hole is slightly smaller than the pin or terminal, so a mechanical interference fit is created as the pin is inserted. When the press fit device is mounted to the printed circuit board, the press fit terminals provide mechanical attachment and electrical coupling between a plated opening in the printed circuit board and the press fit pin or terminal. In the existing approaches, a press fit module has a case package that contains the semiconductor dies mounted to a substrate or board positioned inside the case package. A silicone gel that is formulated for high temperatures fills the case package. The case package has the press fit terminals that are inserted on one side of the case or cover and that are coupled to the semiconductor dies by traces or wire bonds inside the case package to provide the signals. The case module may have a thickness that is greater than the thicknesses of the DIP packages described above. PBA processes for assembly using the press fit case modules requires only one solder wave process, to solder the THD passives to the printed circuit board. The press fit modules are then assembled later by using the interference fits and inserting the press fit pins into through holes in the printed board. By mounting the press fit case modules to the PCB after the single solder wave process is complete, the solder wave process requirement for the maximum package thickness for the IPDs in the PBA process is removed. The minimum clearance distance needed to prevent arcing between the heat shield and the exposed terminals can then be met by simply using a greater thickness for the press fit case packages.

Press fit case modules are time intensive, low volume, and expensive to manufacture. While the printed board assembly process is simplified by use of the press fit case modules, the cost for the press fit case modules for IPMs is prohibitive for some applications. A cost effective, high volume press fit device package for power semiconductor dies is needed. A cost effect semiconductor device package for press fit assembly is also useful for additional applications such as sensors, LEDs, optics, and other devices mounted in module or systems where printed board assembly processes may be used.

SUMMARY

In a described example, an apparatus includes: a package substrate having a device mount surface and on an opposite bottom side surface; a semiconductor die having a device side and an opposing backside, the semiconductor die mounted on the device mount surface of the package substrate with the backside in thermal contact with the package substrate; leads having a base portion attached to the device mount surface, the leads further having an internal portion extending away from a first bend adjacent the base portion at a first angle with respect to the base portion, the internal portion of the leads extending to a second bend, a remaining portion of the leads extending from the second bend and lying in a plane parallel to the device mount surface, the leads further having a third bend in the remaining portion and forming terminals extending from the third bend at a second angle with respect to the plane of the remaining portion; electrical connections coupling the semiconductor die and the leads; and mold compound covering the semiconductor die, the electrical connections, the device mount surface of the package substrate, the base portion of the leads and the internal portion of the leads, the leads extending from the base portion of the mold compound to a board side surface of the mold compound opposite the bottom side surface of the package substrate and to the terminals that are exposed from the board side surface of the mold compound.

In another described example, a method includes: forming a package substrate with leads having a base portion attached to a device mount surface of the package substrate. The leads have an internal portion extending away from a first bend adjacent the base portion at a first angle with respect to the device mount surface of the package substrate. The internal portion of the leads extends to a second bend where a remaining portion of the leads extends from the second bend and are lying in a horizontal plane parallel to the device mount surface of the package substrate. The method continues by mounting a semiconductor die on the device mount surface of the package substrate, the semiconductor die facing away from the device mount surface of the package substrate. Electrical connections are then formed between the semiconductor die and the leads. The semiconductor die, the device mount surface of the package substrate, the electrical connections, the base portion of the leads and the internal portion of the leads are covered with mold compound to form a semiconductor device package.

Terminals are formed from the remaining portion of the leads by making a third bend to shape the leads, the terminals extending from the mold compound at a second angle with respect to the horizontal plane. The terminals extend from a board side surface of the semiconductor device package and are exposed from the mold compound at the board side surface.

BRIEF DESCRIPTION OF THE DRAWINGS

FIG. 6 illustrates, in a flow diagram, a method for forming a semiconductor device package of an arrangement.

DETAILED DESCRIPTION

Figure 1A:
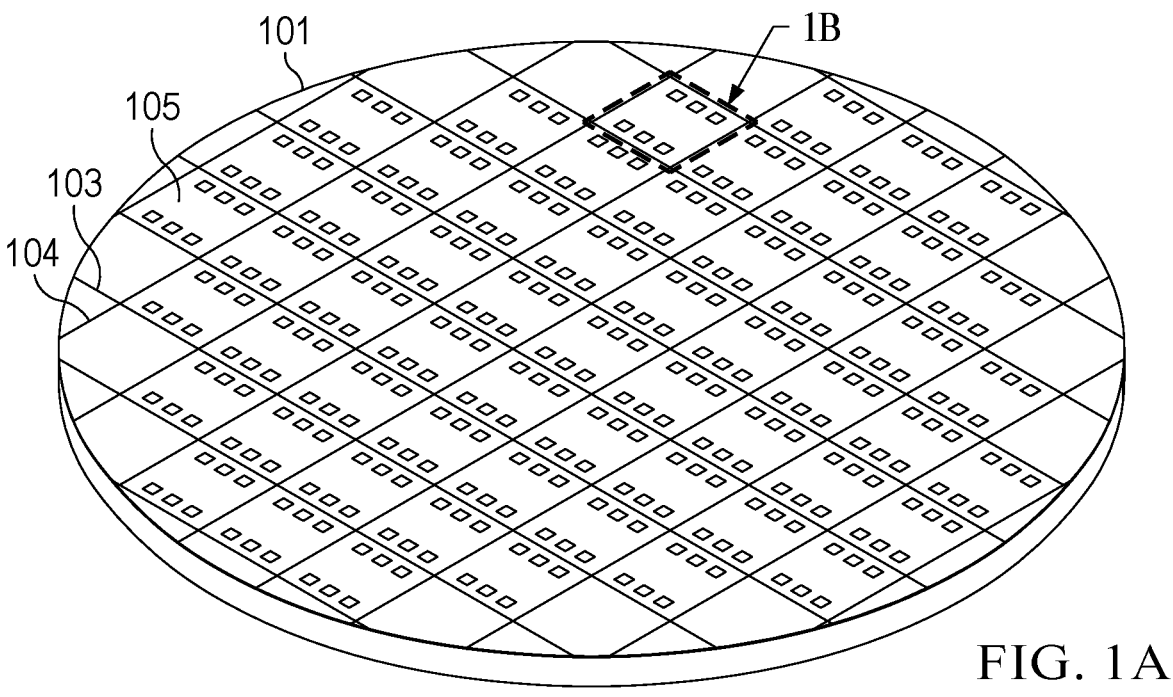
FIGS. 1A-1B illustrate, in a projection view and a close up projection view, respectively, semiconductor dies on a semiconductor wafer, and an individual semiconductor die from the semiconductor wafer for use with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements, conductors, or wires are coupled.

The term "semiconductor die" is used herein. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device. In an example arrangement, the semiconductor die can include a Hall-effect sensor.

The term "semiconductor device package" is used herein. A semiconductor device package has at least one semiconductor die electrically coupled to terminals, and has a package body that protects and covers the semiconductor die. The semiconductor device package can include additional elements. Passive components such as sensors, antennas, capacitors, coils, inductors, and resistors can be included. In some example arrangements, multiple semiconductor dies are packaged together. Circuitry that combines functions such as a sensor, an amplifier semiconductor die and a logic semiconductor die (such as a controller die or digital filter) can be packaged together to form a single semiconductor device package. The semiconductor die is mounted to a package substrate that carries conductive leads. A portion of the conductive leads form external leads or pins for the packaged device. In wire bonded semiconductor device packages used in the arrangements, bond wires or ribbon bonds couple conductive leads attached to a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the external terminals or pins for the semiconductor device package.

The term "package substrate" is used herein. A package substrate is a substrate arranged to receive a semiconductor die and to support the semiconductor die in a completed semiconductor device package. Package substrates can include conductive leadframes, which can be formed from copper, aluminum, stainless steel, steel and alloys such as Alloy 42 and copper alloys. Conductive leads are positioned for coupling to bond pads on the semiconductor die. In an example arrangement, the package substrates can be direct bonded copper (DBC) substrates, or ceramic substrates with copper traces. Conductive leads are mounted to the package substrates and extend from them. The electrical connections from the bond pads of the semiconductor dies to the leads are formed using wire bonds or wedge bonds. The leadframes can be provided in strips, grids or arrays. The conductive leadframes can be provided as a panel or grid with strips or arrays of unit leadframe portions in rows and columns. Semiconductor dies can be placed on respective unit device leadframe portions within the strips or arrays. The leadframe leads may have plated portions in areas designated for wire bond connections to the semiconductor die, for example silver plating can be used.

In packaging semiconductor devices, mold compound may be used to partially cover a package substrate, to cover components, to cover a semiconductor die or multiple semiconductor dies, and to cover the electrical connections from the semiconductor die or dies to the package substrate. This molding process can be referred to as "encapsulation", although some portions of the package substrates are not covered in the mold compound during encapsulation. For example, in the arrangements, portions of the package substrate are a conductive thermal pad that is left exposed, and portions of the leads are left exposed from the mold compound to form terminals or pins. Encapsulation is often a compressive molding process, where thermoset mold compound such as resin epoxy can be used. Mold compound used in electronic packaging is sometimes referred to as "epoxy mold compound" or "EMC". A room temperature solid or powder EMC can be heated to a liquid state, and then transfer molding can be performed by pressing the liquid mold compound into a mold cavity through runners or channels. Unit molds shaped to surround an individual device may be used, or block molding may be used. The molding process forms multiple semiconductor device packages simultaneously for several devices. The devices to be molded can be provided in an array or matrix of several, hundreds or even thousands of devices in rows and columns on a leadframe strip. The semiconductor devices and leadframes are then molded at the same time to increase throughput.

The term "scribe lane" is used herein. A scribe lane is a portion of semiconductor wafer between semiconductor dies. Sometimes the term "scribe street" is used. Once semiconductor processing is completed and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area defined between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

In the arrangements, a semiconductor device package includes a semiconductor die (or multiple semiconductor dies) mounted to the device mount surface of a package substrate such as a DBC package substrate. Leads are mounted to the package substrate and extend away from the device mount surface of the package substrate, while the opposing side of the package substrate can be a thermal pad. The semiconductor dies are electrically coupled to the leads using, for example, aluminum wedge bond connections, copper wedge bond connections, or wire bond connections between the bond pads of the semiconductor dies and the leads. The package substrate has a die pad in a central portion for mounting the semiconductor die or dies. Traces on the package substrate may provide additional electrical connections. The leads have exterior ends outside the mold compound that form terminals for the semiconductor device package and that extend away from the semiconductor device package. In the arrangements, the leads are formed in a trim form tool after molding to extend in a direction normal to a board side surface of the semiconductor device package, and the exposed portion of the leads form terminals or pins for press fit assembly to a PCB. Alternatively, the semiconductor device package of the arrangements can be mounted and soldered using a through hole solder wave assembly. The leads of the semiconductor device package exit the molded package on a bottom or board side surface of the package, and are spaced from the thermal pad on the opposite or top side surface of the molded package by the full thickness of the mold compound. This aspect of the arrangement is particularly advantageous for power devices, providing at least the minimum clearance distance needed between the exposed leads and the thermal pad or a heat sink mounted to the thermal pad.

Figure 1B:
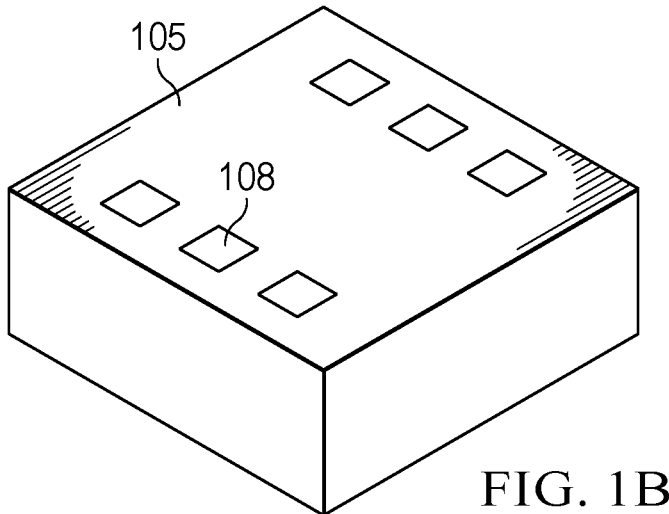

FIGS. 1A and 1B illustrate, in two projection views, a semiconductor wafer 101 having semiconductor devices formed on it (FIG. 1A), and an individual semiconductor die 105 from the wafer 101 for wire bonding and face up mounting (FIG. 1B), respectively. In FIG. 1A, a semiconductor wafer 101 is shown with an array of semiconductor dies 105 formed in rows and columns on a device side surface. The semiconductor dies 105 can be formed using processes typically used in a semiconductor manufacturing facility, including ion implantation, substrate doping, thermal anneals, oxidation, dielectric and metal deposition, sputter, photolithography, pattern, etch, strip, chemical mechanical polishing (CMP), electroplating, and other processes for making semiconductor devices on wafers. Scribe lanes 103 and 104, which are perpendicular to one another and which run in parallel groups across the wafer 101, separate the rows and columns of the completed semiconductor dies 105, and provide areas for dicing the semiconductor wafer 101 so as to separate the semiconductor dies 105 from one another.

FIG. 1B illustrates a single semiconductor die 105 after singulation from the semiconductor wafer 101, with bond pads 108, which are conductive pads that are electrically coupled to devices (not shown) formed on a device side surface of the semiconductor die 105. The bond pads 108 are positioned for connection to leads of a semiconductor device package.

Figure 2A:
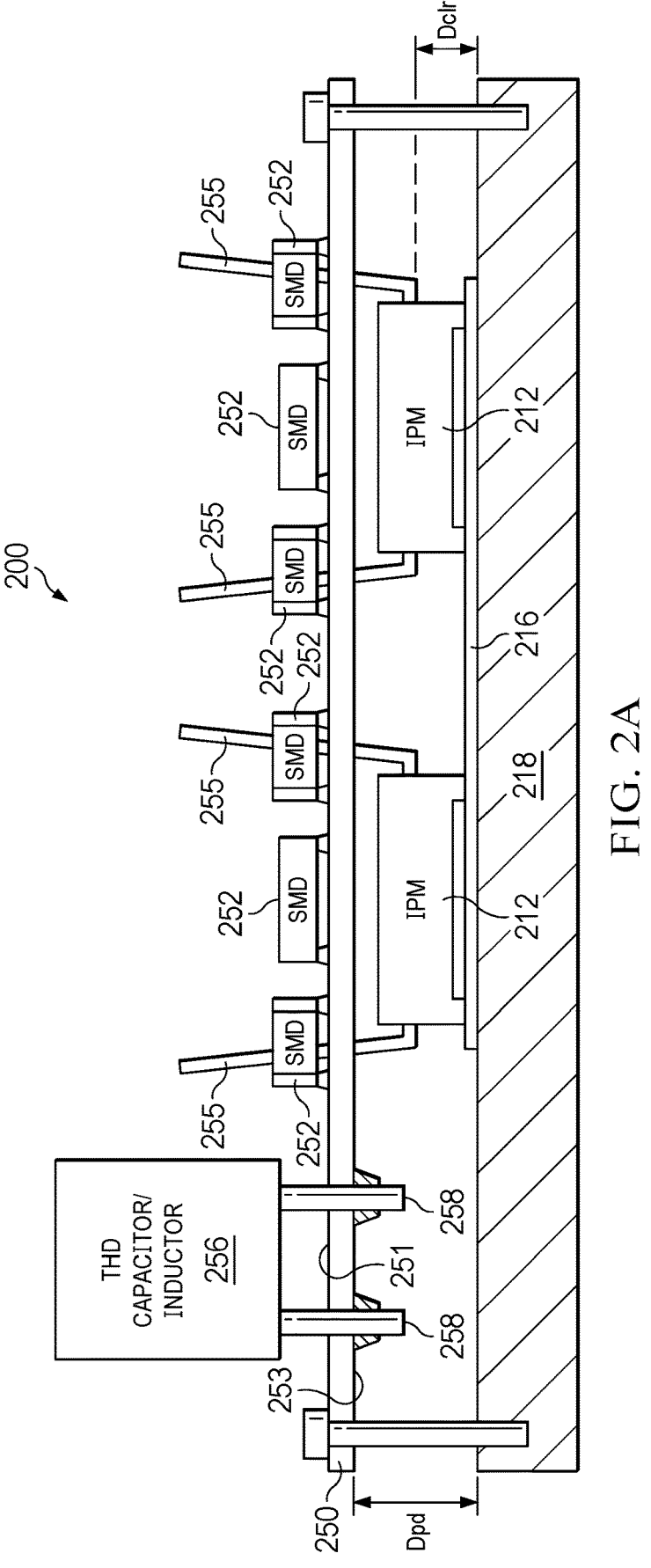
FIGS. 2A-2B illustrate, in side views, two different printed board assemblies for power modules.

FIG. 2A illustrates, in a side view, a power system 200 that includes semiconductor device DIP packages 212 which are integrated power modules (IPMs) that can include semiconductor dies (not visible in FIG. 2A) similar to dies 105. The power system 200 is formed using printed board assembly on a printed circuit board (PCB) 250 with a first side 251, and an opposite side 253. The printed circuit board 250 can be a fiber reinforced glass substrate such as FR4, a BT resin, a ceramic, a laminate or another substrate used for circuit board assemblies. The printed circuit board 250 has plated through holes for mounting through hole devices (THDs), the through holes allow pins or terminals to extend through the printed circuit board and to be coupled to traces on the board by soldering. The printed circuit board 250 can include conductors arranged for surface mount of surface mount devices using solder joints on the first side 251.

In an example assembly process, the DIP IPM devices 212 are mounted to the second side 253 of the board 250 by inserting the device leads 255 into through holes that extend through the board 250. The leads 255 are then soldered to conductive plating in the through holes to make electrical and mechanical connection to the board 250. Solder joints can be formed using a solder wave process to apply molten solder to the first side 251 of the printed circuit board 250 opposite the second side 253. Surface mount devices (SMDs) 252 are then mounted to the first side 251 of the board 250 using surface mount technology. In the example process, the SMDs 252 are mounted after the first solder wave process mounts the DIPs 212 on the second side 253. The SMDs 252 can include passive components such as capacitors, inductors and resistors. The SMDs 252 can be surface mounted using a solder reflow process.

Through hole device 256, which can be a large value capacitor, inductor, coil or other passive component, is then mounted on the first side 251 of the printed circuit board 250 using a second solder wave process to electrically couple and mechanically attach terminals 258 to the second side 253 of the board 250. To perform the second solder wave process, the DIP packages 212 (already mounted by the first solder wave process) have to be covered by a cap, well or reservoir that excludes the liquid solder of the second solder wave process from the DIP packages 212.

Heat sink 218 is then thermally and electrically coupled to thermal pads on the DIP packages 212 by die attach material 216, which can be a die attach epoxy or a die attach film. The die attach material 216 is thermally conductive and can be electrically conductive, or alternatively can be an electrically insulating die attach material, depending on the particular requirements of an application.

The printed board assembly process to form system 200 uses two solder wave processes. When the second solder wave process is performed, the DIP packages 212 have to be protected from the molten solder for mounting the through hole device 256. A cap, well or reservoir is used that lies over the DIP devices while molten solder is applied. The solder is applied to leads 258 to make a solder joint with board 250 and leads 258. This second solder wave process creates a maximum process distance, labeled "Dpd" in FIG. 2A, that requires a DIP package thickness to ne less than this distance. In an example solder wave process, the maximum process distance Dpd can be between 3.5 and 4 millimeters. A second requirement on the assembly of system 200 using the DIP packages 212 is a clearance distance labeled "Dclr." For integrated power modules (IPMs) carrying voltages that are greater than 20 volts, and up to several hundred or more volts, a minimum clearance distance is needed from the heat sink 218 (which is a conductor attached to thermal pads on the top side of the IPMs in DIP packages 212, and which can be at a ground or other fixed potential in operation) to the nearest exposed lead 255. The minimum clearance is necessary to prevent arcing or unwanted leakage current. Arcing can occur when a lead at a high voltage is too close to a conductor at another potential, for example a ground potential, and the air or liquid between the two surfaces undergoes dielectric breakdown, allowing an arc to form between the surfaces and providing an unwanted current path. Damage can occur to a semiconductor device package or to the other devices in the package under arcing. To prevent arcing or unwanted leakage current, the two conductive surfaces have to be spaced from one another by at least the minimum distance Dclr. The need for a minimum clearance distance and for a maximum package thickness in the same assembly creates conflicting requirements in some printed board assembly processes. When DIP packages that are 5.5 millimeters thick, for example, are used to form the power system 200 in a printed board assembly process, the devices cannot meet the maximum production distance Dpd (necessitated by the second solder wave process), while when thin DIP packages that are 4 millimeters thick or less, for example, the packaged devices may meet the maximum production distance Dpd, but cannot also meet the minimum clearance distance Dclr. In an example Dclr is 3.87 millimeters, a minimum distance measured from the heat sink to the exposed leads. Thus, the requirements for production of the power system 200 and board 250 are difficult if not impossible to meet with existing DIP packaged IPM devices.

Figure 2B:
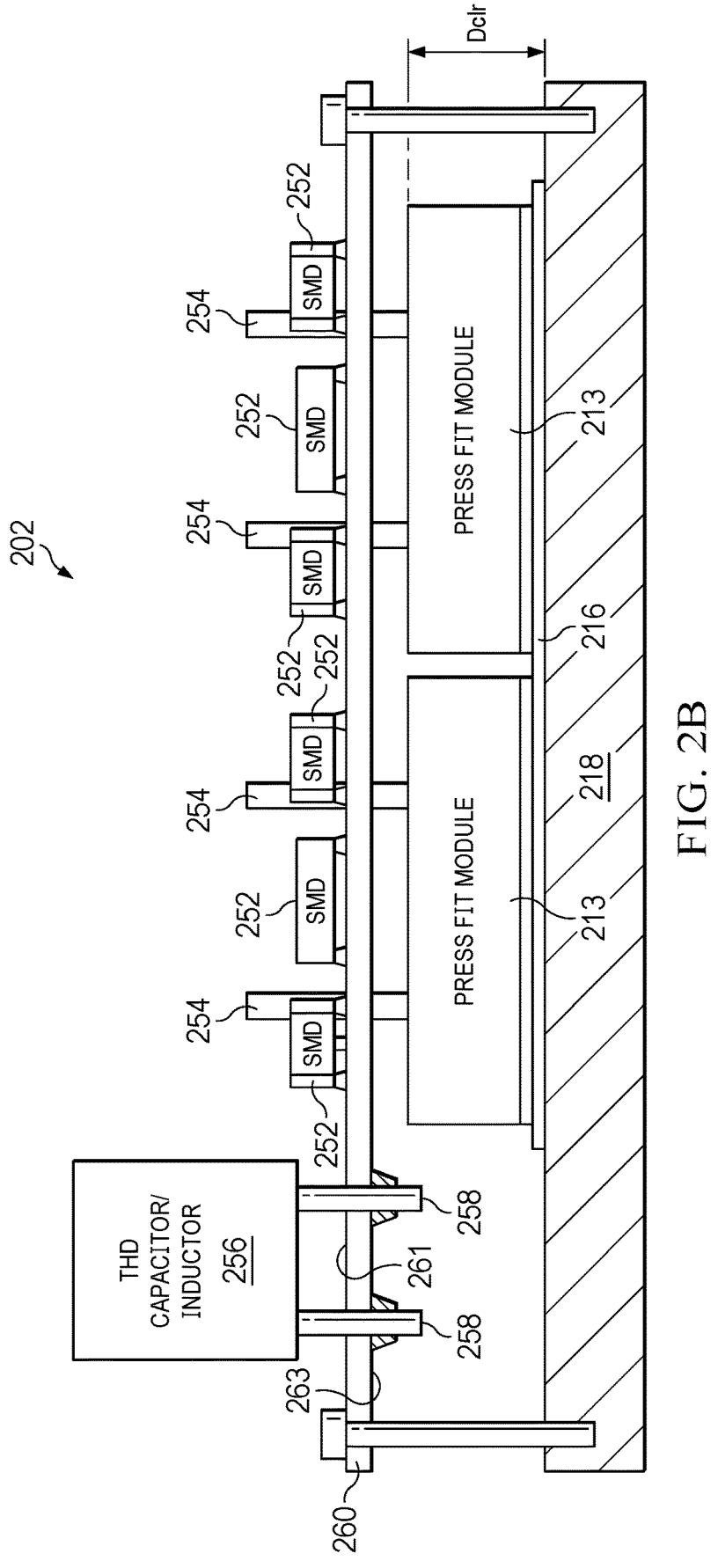

FIG. 2B illustrates an alternative power system 202 in another side view. The common elements of FIGS. 2A and 2B are given like reference numerals in FIG. 2B. For example, the two terminal through hole device 256, which can be a large value capacitor, resistor, or inductor, is the same as in FIG. 2A. The printed circuit board 260 is similar to board 250 in FIG. 2A, however board 260 is arranged for the use of press fit modules 213. The press fit modules 213 are integrated power modules and may contain, for example, semiconductor dies (not visible in FIG. 2A) similar to 105 in FIG. 1B. The press fit power modules 213 can include power FET semiconductor dies such as silicon carbide (SiC) FET or gallium nitride (GaN) FET devices and associated circuitry. A circuit substrate board is used to mount the semiconductor devices in a press fit module case, which can be of ABS, ASA, nylon, or another thermoplastic, metal, plastic or ceramic. The module case provides protection for the semiconductor dies within it, and can be filled with a thermal rated silicone gel to provide additional thermal protection. The case also carries the press fit terminals 254.

To form the power system 200 using the press fit IPMs, a printed board assembly process is used that varies from the one used above. The surface mount devices 252 are mounted to the first side 261 of the circuit board 260 using a solder reflow process for surface mounting. The through hole device 256 is mounted to the printed circuit board 260 on the first side 261 with the terminals 258 extending through printed circuit board 260, and terminals 258 are electrically coupled and mechanically connected to the printed circuit board 260 using a solder wave process on the second side 263 of the printed circuit board 260.

The press fit integrated power modules 213 are then installed on the second side 263 of the circuit board 260 using mechanical pressure. The press fit terminals 254 are shaped to engage with and mechanically connect to plated through holes in the printed circuit board 260, and to make the electrical connections to the press fit modules 213. Because the press fit modules 213 are installed without solder, a second solder wave process is not needed, which eliminates the need for a maximum process distance (see distance Dpd in FIG. 2A). The press fit modules 213 can then be of greater thickness than a conventional DIP package, so that the minimum clearance distance Dclr can be met, for example a case module for an IPM can be 10-12 millimeters in thickness, easily meeting the minimum clearance distance parameter Dclr of 3.87 millimeters for an example PBA for a power system.

However, the press fit modules 213 include circuit boards mounted inside case packages that may be filled with a thermal silicone gel. The press fit terminals of the modules have to be inserted into a module case and soldered or welded. The assembly processes for the press fit modules 213 is low in volume and has low production rates, and requires several pieces to be assembled together, so that the press fit modules 213 are undesirably expensive.

Figure 3:
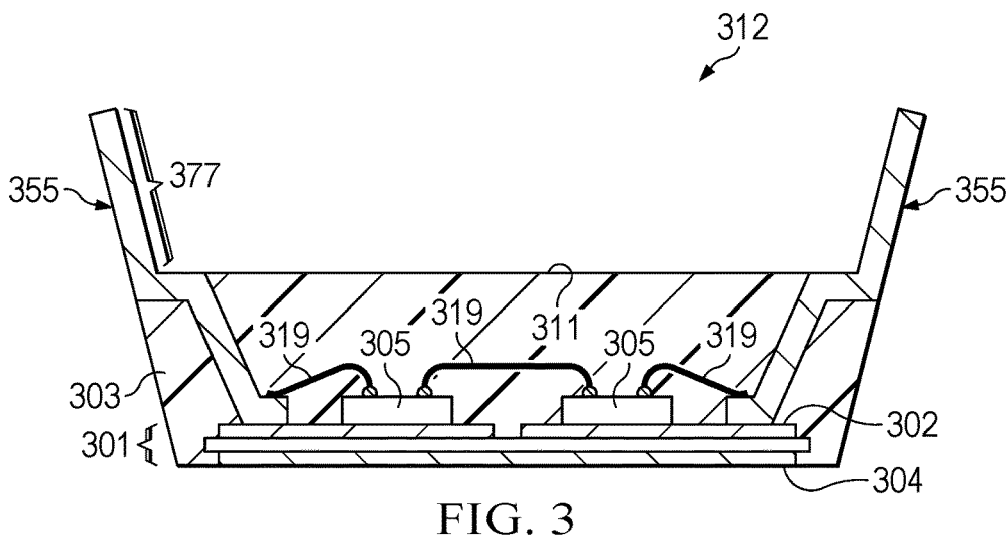
FIG. 3 illustrates, in a cross sectional view, a semiconductor device package of an example arrangement.

FIG. 3 illustrates, in a cross sectional view, a press fit semiconductor device package 312 of an example arrangement. In FIG. 3, semiconductor device package 312 includes semiconductor dies 305 that are similar to the semiconductor die 105 shown in FIG. 1B. The semiconductor dies 305 can be power FET devices, such as a SiC FET or a GaN FET, and can include associated circuitry. In an example a gate driver semiconductor device can be coupled to a power FET within a semiconductor device package. Other arrangements can include multiple power FET devices in one semiconductor device package. Additional semiconductor dies, or additional components such as passive devices (not shown for simplicity of illustration), can be included in the semiconductor device package 312.

The semiconductor device package 312 includes a package substrate 301. The package substrate 301 can be a direct bonded copper (DBC) substrate or other ceramic or laminate material coated with copper or another conductor on opposing sides. Through vias can be used to couple traces on the two sides where needed. The copper can be a thick foil, or can be plated or otherwise deposited, and can be patterned to provide traces. Semiconductor dies 305 are shown mounted on a device mount surface 302 of the package substrate 301. The opposite surface 304, which is the bottom of the semiconductor device package 312 as it is oriented in FIG. 3, has a conductive layer that forms a thermal pad.

Leads 355 are shown attached to the device mount surface 302 of the package substrate 301. Leads 355 are coupled to the semiconductor dies 305 by connections 319, which can be wedge bonded wire or coupled by wire bonds. The leads 355 extend through the mold compound 303 forming the body of semiconductor device package 312 and after some bends, extend away from the board side surface 311 of the semiconductor device package 312 in a vertical (as the elements are oriented in FIG. 3) direction, or in a direction that is approximately normal to a plane of a board side surface 311 of the semiconductor device package 312. The portion 377 of the leads 355 that is exposed from the semiconductor device package 312 forms press fit terminals or pins, emerging from the semiconductor device package 312 on the board side surface 311. This is in sharp contrast to the terminals of a conventional DIP package, which emerge at a midpoint on the sides of the package body. Because the leads 355 extend through the entire thickness of the mold compound 303 that forms the package body for the semiconductor device package 312 before being exposed from the mold compound 303, the minimum clearance distance from the thermal pad 304 of the package substrate 301 on the bottom surface of the semiconductor device package 312 to the exposed portions of the leads 355 is increased.

As is further described below, the leads 355 and the package substrate 301 can be provided as a leadframe, and multiple unit leadframes can be provided in an array, strip or grid form to enable multiple semiconductor device packages to be produced in a single production run. The mold compound 303 can be an epoxy mold compound (EMC) or other dielectric, and resins, epoxies, and plastics can be used. Epoxy mold compound can be a thermoset epoxy resin provided as a room temperature solid which is then heated to a liquid state and forced under pressure into mold chases that hold and surround the package substrate 301, and allowed to cure to form mold compound 303. The leads 355 and package substrate 301, when provided as a leadframe, can be described as a "deep downset" leadframe because the package substrate 301 sits at a bottom surface of the mold compound 303, and leads 355 extend down to the package substrate from a board side surface of the mold compound 303. The use of the deep downset leadframe helps provide the clearance distance needed for power devices, because prior to emerging from the mold compound 303, the leads 355 extend through the entire thickness of the semiconductor device package 312.

Figure 4A:
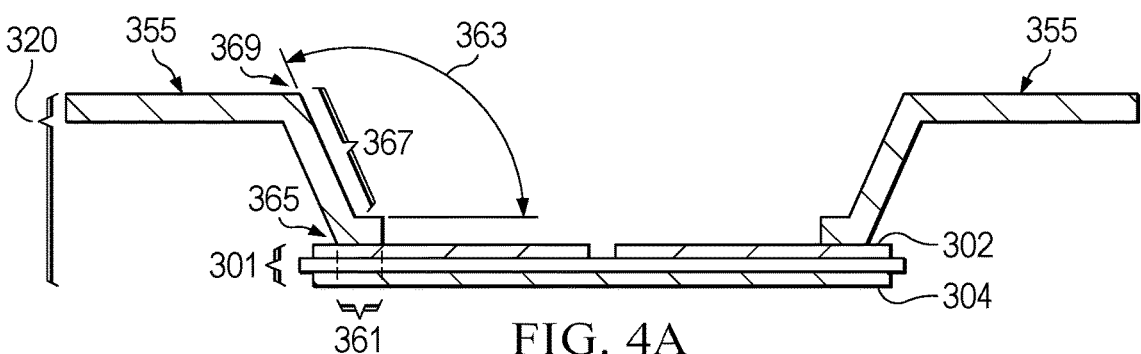
FIGS. 4A-4G illustrate, in a series of views, selected steps for forming semiconductor device packages of the arrangements.

FIGS. 4A-4G illustrate, in a series of views, selected steps for forming semiconductor device packages incorporating the arrangements. In FIG. 4A, a process starts with a downset leadframe 320 having leads 355 attached to a device mount surface 302 of a package substrate 301. The package substrate 301 can be a direct bonded copper substrate with a copper foil bonded on either side (first side 302 is a device mount surface, and second side 304 can be a thermal pad) of a ceramic core, such as aluminum oxide or aluminum nitride. Other laminates and cores with copper traces can be used, printed circuit board materials such as BT resin or fiber reinforced glass such as FR4 with copper layers patterned on opposite sides. The leads 355 can be copper or copper alloy and are attached to the device mount surface 302 of the package substrate 301 by solder or brazing, for example.

The leadframe 320 illustrated in FIG. 4A is a single leadframe unit, but in a production process the leadframes can be provided in an array, grid or strip unit leadframes (not shown) with the leads coupled temporarily by tie bars that connect between the leads and between unit leadframes. The tie bars (not shown) can be removed after molding.

Leads 355 have several portions connected by bends. Base portion 361 is parallel to the device mount surface 302 of the package substrate 301 and is attached to the package substrate 301. An internal lead section 367 (which, when the molding process is complete, will be internal to the semiconductor device package) extends from the base portion 361 from a first bend 365. The internal lead section 367 extends away from the base portion at a first angle 363. The first angle is an obtuse angle in the illustrated example, of about 115 degrees, and can be in a range from 90 degrees (normal) to 160 degrees with respect to the base portion 361.

A second bend 369 connects a remaining portion of the lead 355 to the internal section 367. The remaining portion is in a plane that is parallel to the device mount surface 302 of the package substrate 301 (a horizontal plane as the elements are oriented in FIG. 4A.)

Figure 4B:
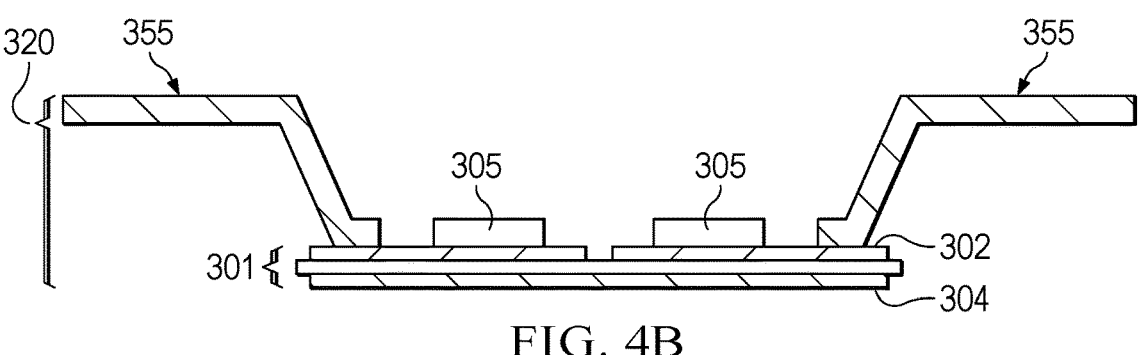

FIG. 4B illustrates the downset leadframe 320 after additional processing. The semiconductor device dies 305 are shown mounted on the device mount surface 302 of package substrate 301. The semiconductor device dies 305 can be mounted by dispensing die attach material on the package substrate 301, such as die attach epoxy or die attach film, and then mounting the dies 305 on the package substrate 301 using the die attach material. The die attach material can be thermally conductive to couple the backside surface of the semiconductor dies 305 to a bottom surface of the package substrate 301, which is a thermal pad. The die attach material and the copper on the package substrate 301 can also electrically couple the thermal pad on the backside surface of the package substrate 301 to the backside of semiconductor dies 305, to provide a ground or other potential to the semiconductor dies 305.

Figure 4C:
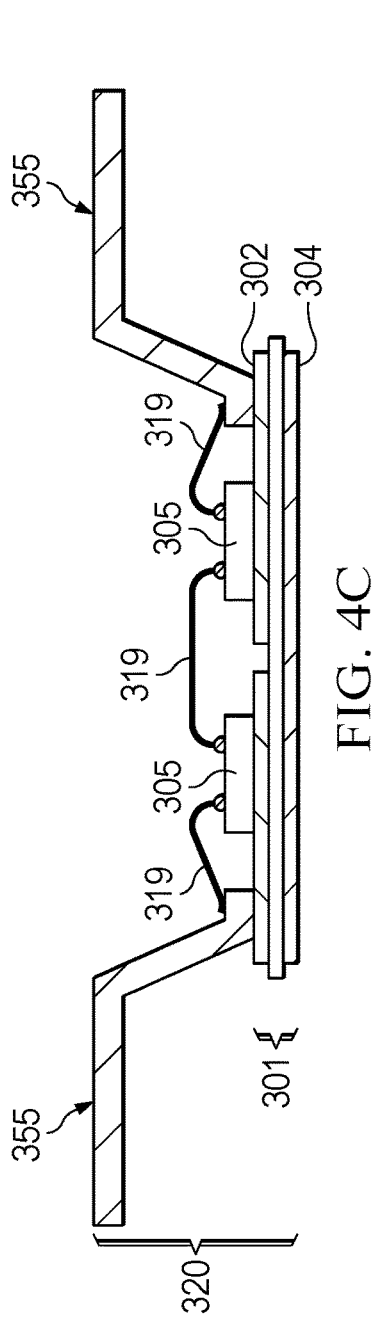

FIG. 4C illustrates the elements of FIG. 4B after an additional process step. In FIG. 4C, bond wire connections 319 are shown coupling the semiconductor dies 305 to the leads 355, and to one another. In an example arrangement, aluminum wires can be wedge bonded to form the wire connections 319 between bond pads (not shown in FIG. 4C) on the semiconductor dies 305 and the leads 355, and between the semiconductor dies 305. In an alternative arrangement, a single semiconductor die 305 can be used. In an further alternative arrangement, copper wire, and copper wedge bonding, can be used to form wire connections 319. Further, in some example arrangements, ball and stitch wire bonding can be used with copper, aluminum, plated copper, gold, silver or other bond wires used in semiconductor packaging. The aluminum or copper wire coupled with wedge bonding is particularly appropriate for high power devices, such as semiconductor dies including SiC FETs and GaN FETs, and for large currents greater than 1 Ampere, for example. The wedge bond wires can have gauges such as XX-YY (or diameters?) For lower power devices such as digital semiconductor dies, ball and stitch wire bonding can be used with finer bond wires as shown in FIG. 4C. If wire bond connections are used for connections 319, gold, copper, silver, or aluminum bond wire can be used, and palladium coated copper bond wire can be used.

Figure 4D:
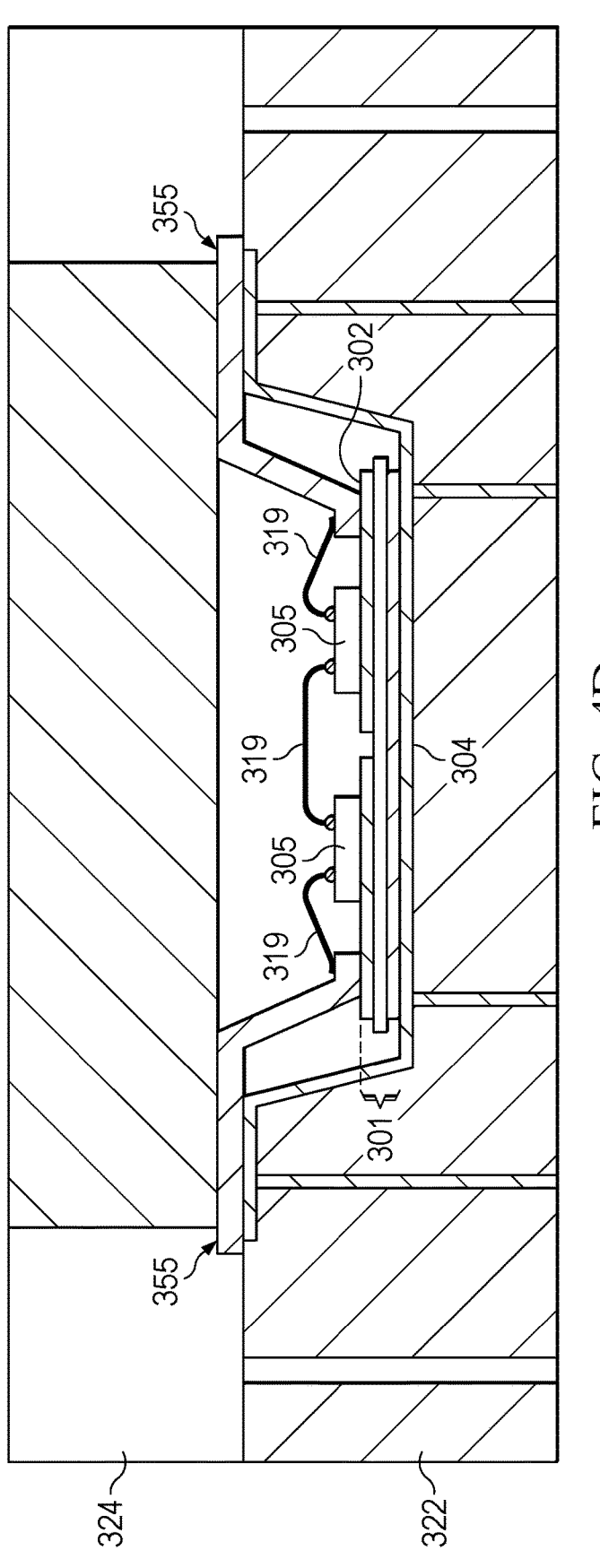

FIG. 4D illustrates the elements of FIG. 4C in a further process. In FIG. 4D, a molding process begins with the package substrate 301 and the leads 355 positioned in a mold tool with a top chase 324 and a bottom chase 322. The package substrate 301 is positioned at the bottom of cavity in the bottom chase 322 ready for transfer molding. The top chase 324 defines a board side surface and is over and contacting the leads 355, after molding the leads 355 which will be coplanar with a board side surface of the mold compound. The thermal pad 304 of the bottom of the package substrate 301 is positioned at the bottom of the cavity in the mold tool so that it will not be covered by mold compound during molding.

Figure 4E:
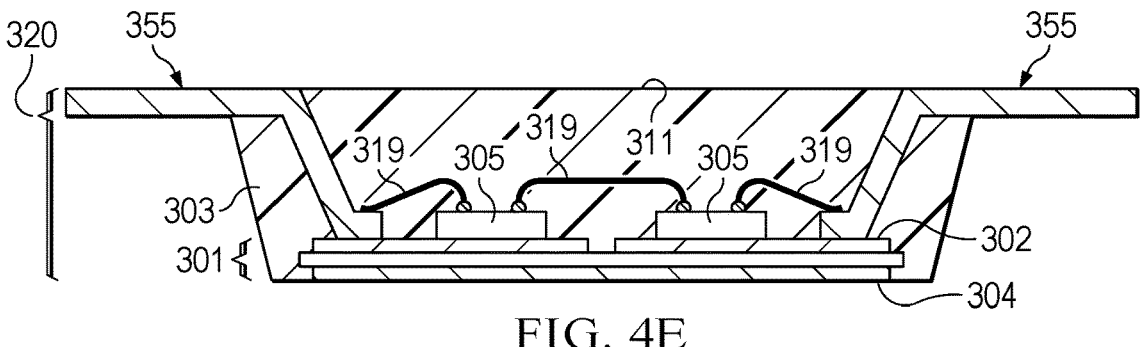

FIG. 4E illustrates in another cross sectional view the leadframe 320 and the other elements shown in FIGS. 4C and 4D after the molding process of FIG. 4D is complete. Mold compound 303 covers the device mount surface 302 of the package substrate 301, while the bottom surface of the package substrate 301 is exposed from the mold compound 303 to form a thermal pad 304. The semiconductor dies 305 (two are shown but in additional arrangements there could be more, or only one) are covered by the mold compound 303, as are the wire bond connections 319. The leads 355 have portions covered by the mold compound 303 that extend from the device mount surface 302 of the package substrate 301, through the mold compound 303, and the leads 355 have portions that emerge from the mold compound 303 at the board side surface of the mold compound 303.

Figure 4F:
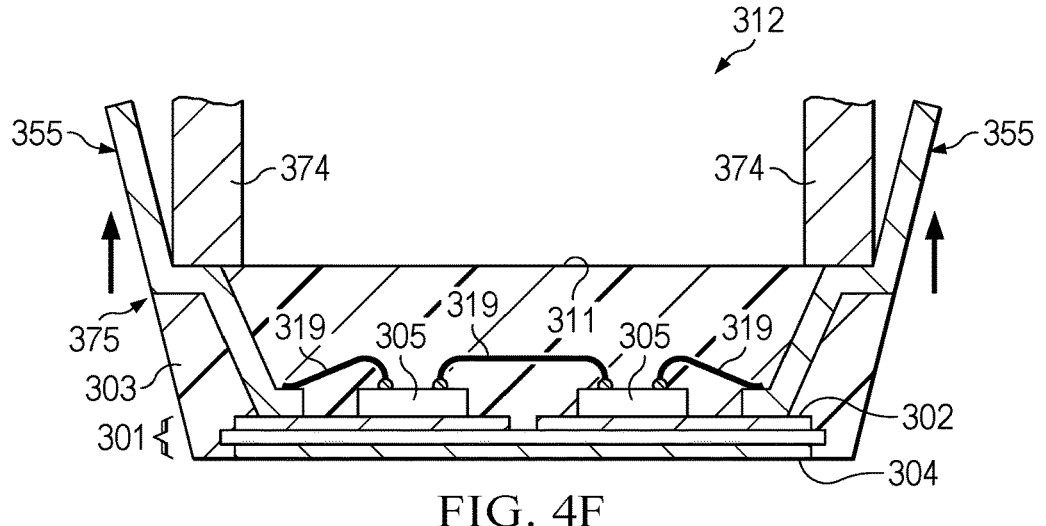

FIG. 4F illustrates, in a cross sectional view, the package substrate 301 and the other elements of FIG. 4E after an additional process in a form tool 374. In the transition from FIG. 4E to FIG. 4F, after molding, trim form tools are used first to trim away tie bars or other unwanted metal and mold compound flash between leads (not shown for simplicity of illustration) that may result from molding, and then the trim form tool is used to form the leads. In FIG. 4F, the leads 355 are shown being formed by form tool 374 to form terminals or pins that are extend at an approximately normal angle from the board side surface 311 of the mold compound 303 that forms the package body. The leads 355 are clamped by the form tool 374 on the inside and are formed by arms of the forming tool on the outside edge, to push the leads 355 away from the mold compound 303 to form the terminals that extend at a normal angle or at a similar angle, example angles range from 85 to 95 degrees with respect to the board side surface 311 of the mold compound 303, at a third bend 375 (see FIG. 4A that shows first bend 365 and second bend 369). The terminals or pins can be arranged for press fit assembly, alternatively the terminals can be arranged for solder in a through hole printed board assembly to mount the semiconductor device package.

Figure 4G:
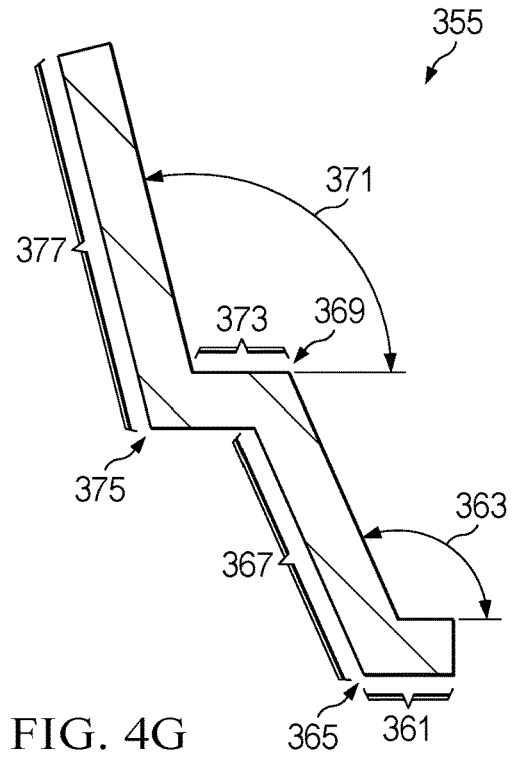

FIG. 4G illustrates additional details of an example lead 355 of a completed semiconductor device package used for an example arrangement. The lead 355 has a base portion 361, in the arrangements this base portion is in a plane parallel to the device mount surface of the package substrate (see device mount surface 302 and package substrate 301 in FIG. 4E, for example) and is attached to it by brazing or solder. A first bend 365 is shown. An internal lead section 367 is shown extending from the base portion 361 at the first bend 365, forming an angle 363. The angle 363 can vary but in the illustrated arrangements is an obtuse angle of about 90 to 160 degrees with respect to the base portion 361. The internal lead section 367 in the arrangements extends through the thickness of the mold compound (see mold compound 303 in FIG. 4F). A horizontal section 373 extends from the internal section 367 from a second bend 369 to the third bend 375 and is arranged to be parallel to the board side surface of the mold compound 303 in the arrangements. In an example arrangement the horizontal section 373 is amount 0.X millimeters long, and at least a board side surface of the horizontal section is coplanar with the mold compound formed in the arrangements. This is because as the package substrate 301 is placed in the mold tool, the top of the cavity, formed by an upper mold chase, is placed on the horizontal portion of the leads 355 and so that during molding, the mold compound stops at the same plane as the board side surface of the lead 355.

External section 377 extends from the third bend 375 in the horizontal section 373 to form a second angle 371, which can be a normal angle, or can slightly deviate from normal. The external section 377 forms vertical pins or terminals that extend away from the board side surface of the mold compound in the arrangements, importantly the external section 377 and portions of the horizontal section 373 are exposed from the board side surface of the mold compound, so that the clearance distance from a thermal pad (or a heat sink attached to it) to the exposed external section 377 includes the thickness of the mold compound of the semiconductor device package, which increases the clearance distance (when compared to existing DIP semiconductor device packages). The clearance distance is an important parameter for power device applications. Increasing the clearance distance reduces or eliminates the possibility of arcing between the terminals and the thermal pad or heat sink, which can be at very different potentials.

The external section 377 of leads 355 can be arranged for press fit assembly, which reduces the number of solder operations in a printed board assembly for a system, eliminating a process requirement for a maximum semiconductor device package thickness. By reducing the solder operations needed to assembly a system, the cost of assembly is reduced, and by increasing the clearance distance that can be obtained by use of the arrangements, the reliability of the system can be increased.

Figure 5:
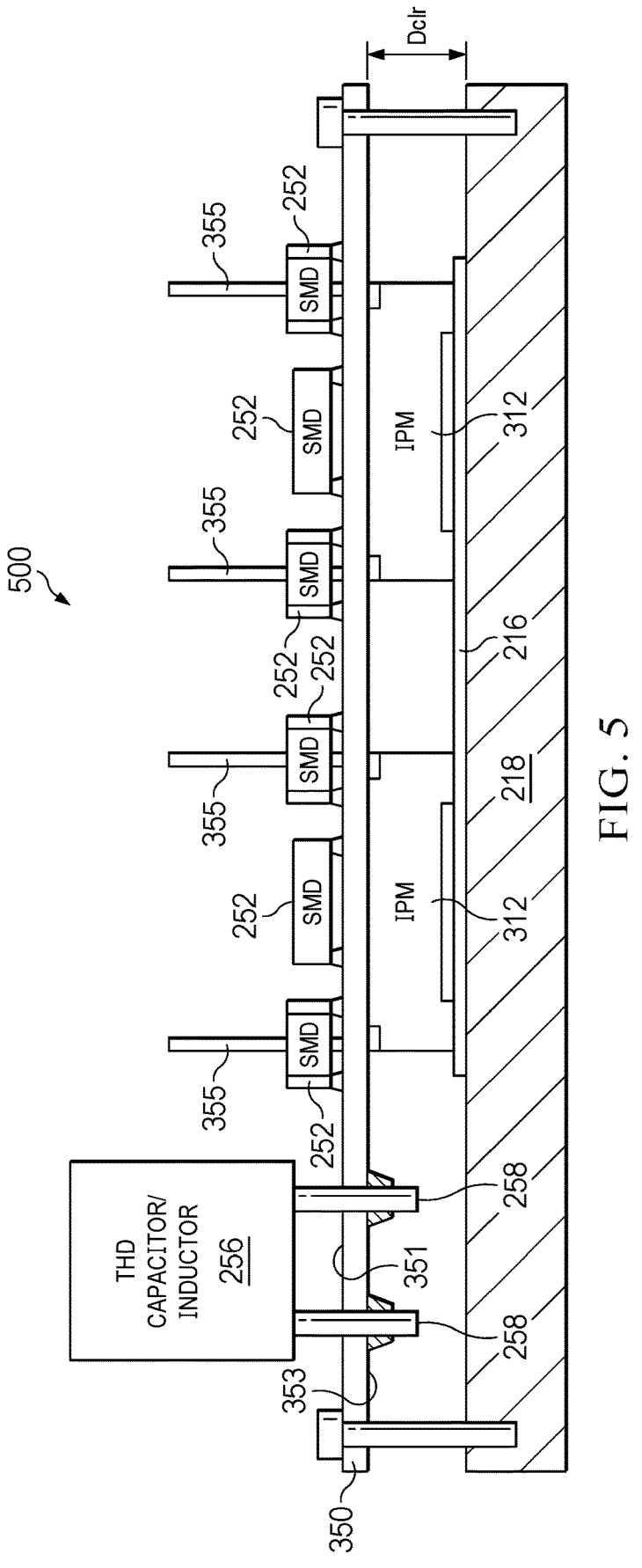
FIG. 5 illustrates, in a side view, a printed board assembly for a power module using example arrangements.

FIG. 5 illustrates, in a side view, a system 500 including semiconductor device packages 312 of an example arrangement (see FIG. 3) mounted in a printed board assembly. In FIG. 5, a printed circuit board 350 with through hole connections is shown, this board can be similar to the board 260 as in FIG. 2B, for example. Printed circuit board 350 is arranged to use press fit assembly for the semiconductor device packages 312. Semiconductor device packages 312, which are formed using the arrangements, are shown press fit mounted to the second side 353 (the bottom side as the elements are oriented in FIG. 5) of the printed circuit board 350. Some of the elements shown in FIG. 5 are common with FIGS. 2A and 2B and the same reference numerals are used. A two terminal passive component 256, a THD, is mounted with terminals extending from the first side 351 of the printed circuit board 350 to the second side 353. Surface mount devices 252 are shown mounted to the first side 351 of the printed circuit board 350 using surface mount technology (SMT). A heat sink 218 is mounted to the second side 353 of printed circuit board 350 and is in electrical and thermal contact with the thermal pads of the semiconductor device packages 312, and is attached to the thermal pads using die attach epoxy or a die attach film as die attach material 216.

To assemble the printed board 350 using the press fit semiconductor device packages 312 of the example arrangement, a solder wave operation can be performed to mount the through hole device 256, the solder wave is applied to the second side 353 of the printed board 350. The surface mount devices 252 can then be mounted on the first side 351 of the printed circuit board 350 using a solder reflow process. The semiconductor device packages 312 can then be mounted using press fit assembly. Because the semiconductor device packages 312 are mounted last using a press fit assembly, no second solder wave operation is needed, which removes a process parameter requirement on the semiconductor device package thickness that was required for assembling the system of FIG. 2A (which was formed without the use of the arrangements). The clearance distance Dclr is a minimum distance, and because the leads 355 exit the semiconductor device packages 312 on a board side surface, this parameter requirement is easily met (compared to systems using existing DIP packages formed without the arrangements as shown in FIG. 2A). For example using a semiconductor device package of the arrangements with a body thickness of 4 millimeters, an example minimum clearance distance Dlcr of 3.87 millimeters is clearly met.

In an alternative approach for assembling system 500, two solder wave processes can be used, in a process similar to that used for the system of FIG. 2A. The use of the semiconductor device package of the arrangements allows for the maximum distance from the bottom of the semiconductor packages to the printed circuit board (Dpd in FIG. 2A) to be reduced over conventional DIP packages, so that the maximum distance Dpd can still be met by semiconductor device packages 312 of the arrangements, while minimum clearance distance Dclr can also be met.

In the alternative approach using an example solder wave printed board assembly with the arrangements, the process can begin with the second side 353 of the printed circuit board 350 oriented on to be top, and semiconductor device packages 312 can be mounted on the second side of the printed circuit board 350, with the solder wave process applied to first side 351 of the printed circuit board 350. During the first solder wave process, the leads 355 extend into through holes in the printed circuit board 350. The semiconductor device packages 312 are mounted using the first solder wave process. The printed circuit board 350 is then rotated so the first side 351 is on top, as shown in FIG. 5, and the surface mount devices 252 can be mounted using a solder reflow process to form solder joints on the first side 351 of the printed circuit board 350. A second solder wave process is then performed to mount the through hole passive device 256. During the second solder wave process, the semiconductor device packages 312 are shielded by a dam or cover that excludes the solder from them, and the solder wave process solders the terminals of the through hole device 256 to the second side 353 of the printed circuit board 350. The heat sink 218 can then be mounted to the bottom of package where thermal pads of the packaged semiconductor device 312 are located by thermal interface material.

FIG. 6 illustrates, in a flow diagram, steps for forming an arrangement corresponding to the steps shown in the series of illustrations 4A-4E.

At step 601, the method begins by forming a package substrate with leads having a base portion attached to a device mount surface of the package substrate, the leads having an internal portion extending away from a first bend in the leads adjacent the base portion at a first angle with respect to the device mount surface of the package substrate, the internal portion of the leads extending to a second bend in the leads where a remaining portion of the leads are extending from the second bend and lying in a horizontal plane parallel to the device mount surface of the package substrate. (See FIG. 4A, showing the device mount surface 302 of package substrate 301, leads 355, a first bend 365, with a first angle 363, internal section 367, and a second bend 369.)

At step 603, the method continues by mounting a semiconductor die on the die pad, the semiconductor die facing away from the die pad (see FIG. 4B, with semiconductor dies 305 mounted on the device mount surface 302 of package substrate 301).

At step 605, the method continues by forming electrical connections between the semiconductor die and the interior ends of the leads of the leadframe. (See connections 319 between semiconductor dies 305 and leads 355).

At step 607, the method continues by covering the semiconductor die, the device mount surface of the package substrate, the electrical connections, the base portion of the leads and the internal portion of the leads with mold compound to form a semiconductor device package. (See FIG. 4D, showing a mold tool operation, and FIG. 4E, showing mold compound 303, covering connections 319, portions of leads 355, the semiconductor dies 305, and the device mount surface of the package substrate 301.)

At step 609, the method continues by forming terminals from the remaining portion of the leads by making a third bend to shape the ends of the leads extending from the mold compound at a second angle with respect to the horizontal plane, the leads extending from the board side surface of the semiconductor device package to form terminals exposed from the mold compound. (See the forming operation shown in FIG. 4F, with the third bend 375, and the board side surface 311 of the mold compound 303, and the details of the lead 355 shown in FIG. 4G).

Use of the arrangements provides a semiconductor device package arranged for press fit assembly. The terminals of the semiconductor device package are exposed from the mold compound of the semiconductor device package at a board side surface. Leads extend from the package substrate on a bottom portion of the semiconductor device package through the thickness of the mold compound, increasing a clearance distance for integrated power modules formed in the semiconductor device packages (over modules formed without use of the arrangements). Press fit assembly simplifies the printed board assembly process used to mount the semiconductor device packages of the arrangements on circuit boards or modules. The semiconductor device packages may be used to package power FET devices, integrated power modules, or other semiconductor devices and components to be mounted on printed circuit boards or modules. The arrangements eliminate the conflicting requirements on semiconductor device packages for printed board assembly of power systems that occurred for conventional semiconductor device packages. The semiconductor device packages of the arrangements can be mounted using solder or solder wave processes.

Modifications are possible in the described arrangements, and other alternative arrangements are possible within the scope of the claims.

What is claimed is:

1. An apparatus, comprising:
   a package substrate having a device mount surface and an opposite bottom side surface;
   a semiconductor die having a device side and an opposing backside, the semiconductor die mounted on the device mount surface of the package substrate with the backside in thermal contact with the package substrate;
   leads having a base portion attached to the device mount surface, the leads further having an internal portion extending away from a first bend adjacent the base portion at a first angle with respect to the base portion, the internal portion of the leads extending to a second bend, a remaining portion of the leads extending from the second bend and lying in a plane parallel to the device mount surface, the leads further having a third bend in the remaining portion and forming terminals extending from the third bend at a second angle with respect to the plane of the remaining portion;
   electrical connections coupling the semiconductor die and the leads; and
   mold compound covering the semiconductor die, the electrical connections, the device mount surface of the package substrate, the base portion of the leads and the internal portion of the leads; the leads extending to a board side surface of the mold compound opposite the bottom side surface of the package substrate, a portion of the leads after the third bend exposed and projecting from the mold compound, wherein a plane along a surface of the remaining portion of the leads is coplanar with a plane along the board side surface of the mold compound.

2. The apparatus of claim 1, wherein the package substrate is a direct bonded copper (DBC) substrate.

3. The apparatus of claim 1, wherein the package substrate is a ceramic with conductive traces on the device mount surface and a thermal pad on the bottom side surface.

4. The apparatus of claim 1, wherein the semiconductor die is mounted to the package substrate by a thermally conductive die attach material, and the bottom side surface of the package substrate is thermally coupled to the semiconductor die.

5. The apparatus of claim 1, wherein the semiconductor die is a power field effect transistor (FET) device of silicon carbide (SiC) or gallium nitride (GaN).

6. The apparatus of claim 1, wherein the electrical connections are aluminum wires coupled to the semiconductor die and the leads by aluminum wedge bonds.

7. The apparatus of claim 1, wherein the electrical connections are copper wire coupled to the semiconductor die and the leads by copper wedge bonds.

8. The apparatus of claim 1, wherein the electrical connections are wire bonds of copper, plated copper, palladium coated copper, aluminum, silver, or gold bond wire.

9. The apparatus of claim 1 wherein the semiconductor die is a first semiconductor die, and further comprising a second semiconductor die, wherein the first semiconductor die is electrically coupled to the second semiconductor die.

10. A method of forming a semiconductor package, comprising:
    forming a package substrate with leads having a base portion attached to a device mount surface of the package substrate, the leads having an internal portion extending away from a first bend adjacent the base portion at a first angle with respect to the device mount surface of the package substrate, the internal portion of the leads extending to a second bend where a remaining portion of the leads extend from the second bend and are lying in a horizontal plane parallel to the device mount surface of the package substrate;
    mounting a semiconductor die on the device mount surface of the package substrate, the semiconductor die having a device side surface facing away from the device mount surface of the package substrate;
    forming electrical connections between the semiconductor die and the leads;
    covering the semiconductor die, the device mount surface of the package substrate, the electrical connections, the base portion of the leads and the internal portion of the leads with mold compound to form a semiconductor device package having a board side surface facing away from the device mount surface and having a thickness between the package substrate and the board side surface; and
    forming terminals from the remaining portion of the leads by making a third bend to shape the remaining portion of the leads, the terminals extending from the board side surface of the mold compound at a second angle with respect to the board side surface of the semiconductor device package, wherein a plane along a surface of the remaining portion of the leads that extend from the second bend is coplanar with a plane along the board side surface of the mold compound.

11. The method of claim 10, wherein forming electrical connections further comprises coupling the semiconductor die to the leads using aluminum wire and aluminum wedge bonding.

12. The method of claim 10, wherein forming electrical connections further comprises coupling the semiconductor die to the leads using copper wire and copper wedge bonding.

13. The method of claim 10, wherein forming electrical connections further comprises:

forming wire bonds between the semiconductor die and the leads using copper, plated copper, palladium coated copper, silver, aluminum or gold bond wire.

14. The method of claim 10, wherein mounting a semiconductor die comprises mounting a first power field effect transistor (FET) semiconductor die, and further comprising mounting a second semiconductor die electrically coupled to the first power FET semiconductor die.

15. The method of claim 10, wherein forming terminals further comprises bending the remaining portion of the leads to form the second angle of between 85 and 95 degrees with respect to the board side surface of the mold compound.

16. The method of claim 10, wherein forming terminals further comprises forming the terminals for press fit assembly into a through hole in a printed circuit board.

17. An apparatus, comprising:

a printed circuit board having a first side and an opposite second side;

surface mount devices mounted to the first side by surface mount technology solder joints;

a through hole device mounted to the first side and having terminals extending through holes in the printed circuit board to the second side, and solder connections to the terminals on the second side of the printed circuit board; and an integrated power module mounted to the second side and having press fit terminals mounted to through holes in the printed circuit board by an interference fit, the press fit terminals extending through the printed circuit board to the first side, the integrated power module further comprising:

a package substrate having conductive traces on a device mount surface and having an opposite bottom side surface forming a thermal pad;

a semiconductor die having a device side and an opposing backside, the semiconductor die mounted on the device mount surface of the package substrate with the backside in thermal contact with the package substrate;

leads having a base portion attached to the device mount surface of the package substrate, the leads having an internal portion extending away from a first bend adjacent the base portion at a first angle with respect to the device mount surface, the internal portion of the leads extending to a second bend where a remaining portion of the leads extend from the second bend and the remaining portion of the leads lie in a plane parallel to the device mount surface of the package substrate, the remaining portion of the leads extending to a third bend and forming terminals extending from the third bend, the terminals at a second angle to a horizontal plane of the remaining portion;

electrical connections between bond pads on the semiconductor die and the leads;

mold compound covering the semiconductor die, the electrical connections, the device mount surface of the package substrate, and the internal portion of the leads, with the bottom side surface of the package substrate being exposed from the mold compound, and the terminals exposed from a board side surface of the mold compound that is opposite the bottom side surface of the package substrate; and the leads extending from the device mount surface of the package substrate through the mold compound to the board side surface of the mold compound, the terminals exposed from the mold compound at the board side surface and extending at the second angle with respect to the board side surface of the mold compound.

18. The apparatus of claim 17, wherein the integrated power module is a first integrated power module, and further comprising a second integrated power module having press fit terminals mounted to the second side of the printed circuit board.

19. The apparatus of claim 17, wherein the semiconductor die is a power FET device that is a gallium nitride (GaN) FET device or a silicon carbide (SiC) FET device.

20. The apparatus of claim 17, and further comprising a heat sink mounted over the integrated power module and the second side of the printed circuit board, the heat sink in thermal contact with the thermal pad of the package substrate of the integrated power module.

* * * * *